(12) United States Patent
Kim

(10) Patent No.: US 10,816,022 B2
(45) Date of Patent: Oct. 27, 2020

(54) GAP REGULATOR OF MULTI DISPLAY AND MULTI DISPLAY HAVING THE SAME

(71) Applicant: LG DISPLAY CO., LTD., Seoul (KR)

(72) Inventor: Yongjoon Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/587,916

(22) Filed: Sep. 30, 2019

(65) Prior Publication Data

US 2020/0102977 A1  Apr. 2, 2020

(30) Foreign Application Priority Data

Sep. 28, 2018 (KR) .................. 10-2018-0116182

(51) Int. Cl.
*F16B 12/10* (2006.01)
*H05K 5/00* (2006.01)
*G09F 9/302* (2006.01)
*H05K 5/02* (2006.01)

(52) U.S. Cl.
CPC ............ *F16B 12/10* (2013.01); *G09F 9/3026* (2013.01); *H05K 5/0017* (2013.01); *H05K 5/0021* (2013.01); *H05K 5/0217* (2013.01)

(58) Field of Classification Search
CPC .... F16B 12/10; H05K 5/0017; H05K 5/0217; H05K 5/0021; F16M 11/00; G09F 9/3026; G09F 9/33; G06F 3/16; G06F 3/017
See application file for complete search history.

(56) References Cited

U.S. PATENT DOCUMENTS

| 6,568,873 | B1 * | 5/2003 | Peterson | E06B 3/667 403/300 |
| 8,197,088 | B2 * | 6/2012 | Patterson | G06F 3/1446 362/249.02 |
| 9,151,060 | B2 * | 10/2015 | Khongbantabam | E04F 13/0862 |
| 9,462,099 | B2 * | 10/2016 | Wilson | H04M 1/185 |
| 9,877,406 | B2 * | 1/2018 | Hochman | H05K 7/1452 |
| 10,121,407 | B2 * | 11/2018 | Brooks | G06F 3/1446 |
| 2009/0009998 | A1 * | 1/2009 | Malstrom | G09F 9/3026 362/249.01 |
| 2015/0362160 | A1 * | 12/2015 | Andreasen | F21V 23/06 362/97.1 |
| 2016/0153481 | A1 * | 6/2016 | Peng | F16B 12/10 403/345 |
| 2019/0179592 | A1 * | 6/2019 | Hyeon | G06F 3/1446 |

* cited by examiner

*Primary Examiner* — Abhishek M Rathod
(74) *Attorney, Agent, or Firm* — Birch, Stewart, Kolasch & Birch, LLP

(57) ABSTRACT

A gap regulator of a multi display can include a first fixing portion, a second fixing portion, a holder, a first plate spring, a second plate spring, and a pressurizing switch. The first fixing portion is fixed to a first display of the multi display. The second fixing portion is fixed to a second display of the multi display. The holder includes a ceiling portion, a first side wall, and a second side wall facing the first side wall. The holder is coupled to the first fixing portion and the second fixing portion. The first plate spring is disposed between the first side wall and the first fixing portion. The second plate spring is disposed between the second side wall and the second fixing portion. The pressurizing switch is coupled to the holder and pressurizes the first plate spring and the second plate spring to the first fixing portion and the second fixing portion, respectively.

17 Claims, 9 Drawing Sheets

[FIG. 1]
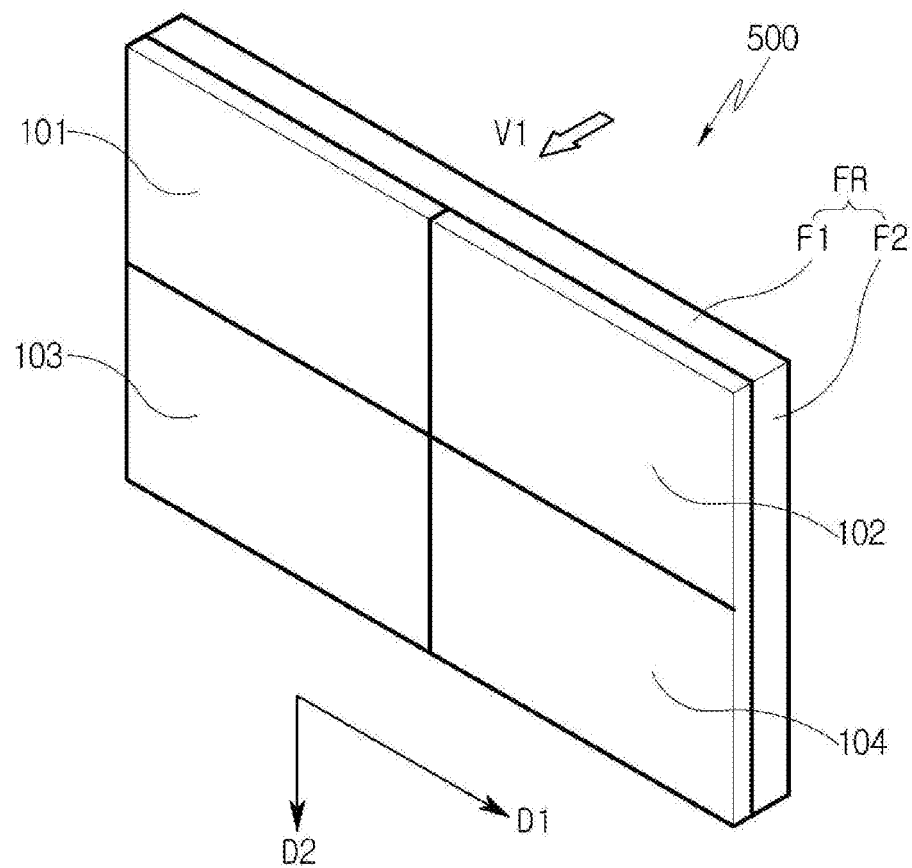

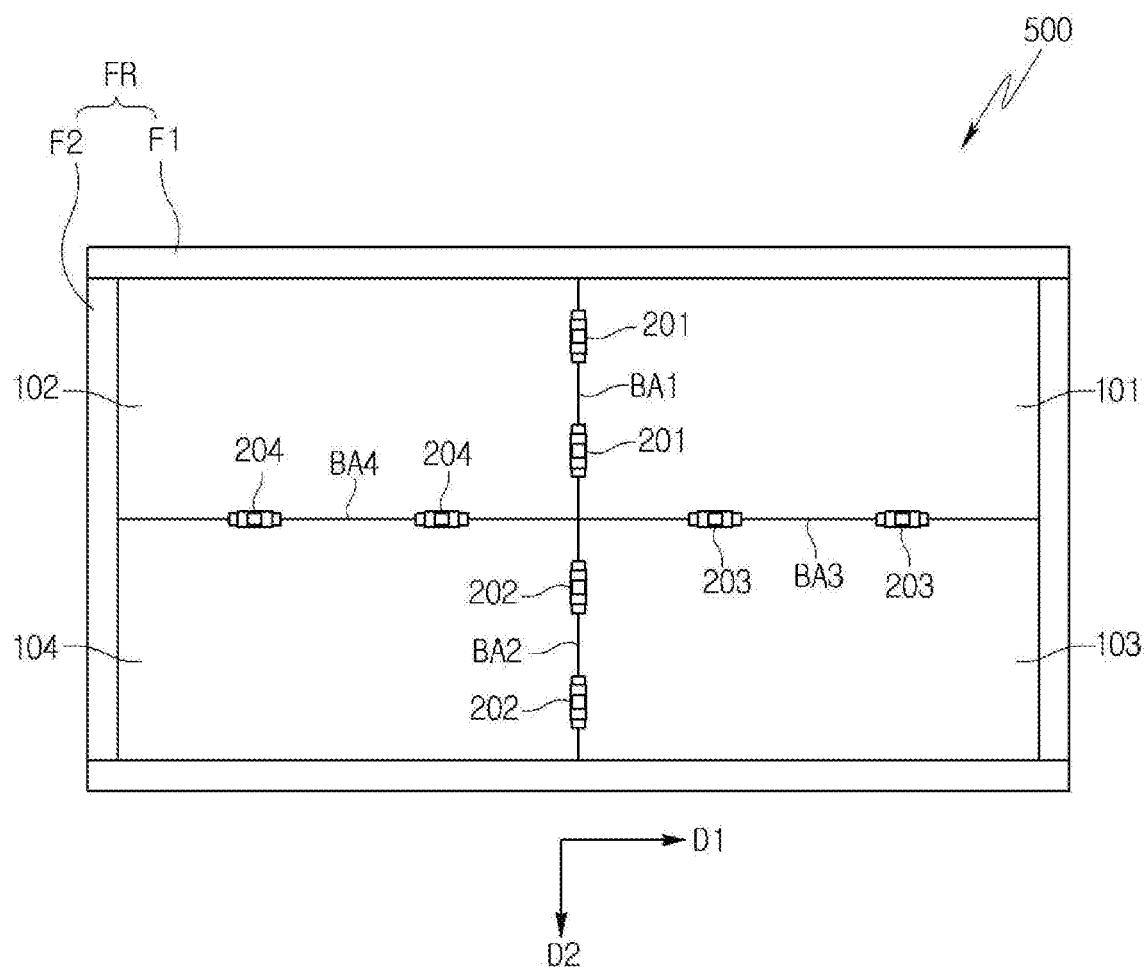
[FIG. 2]

[FIG. 3]
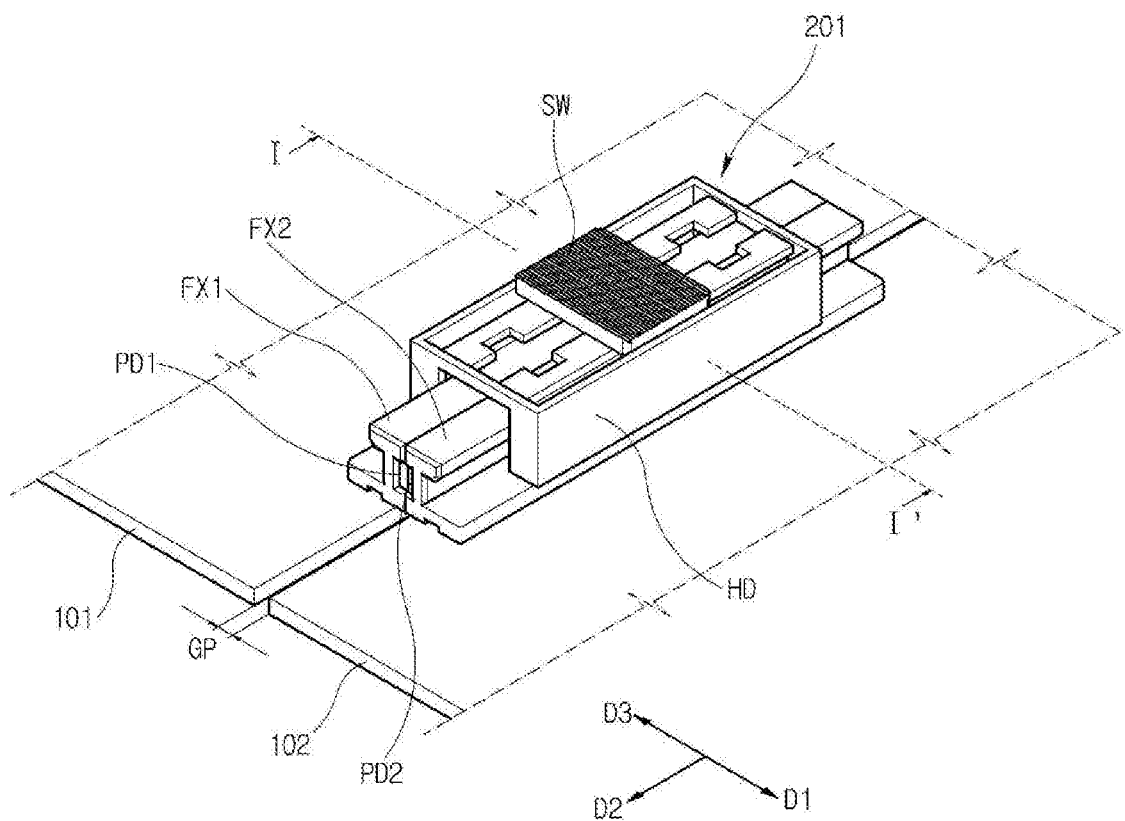

[FIG. 4]
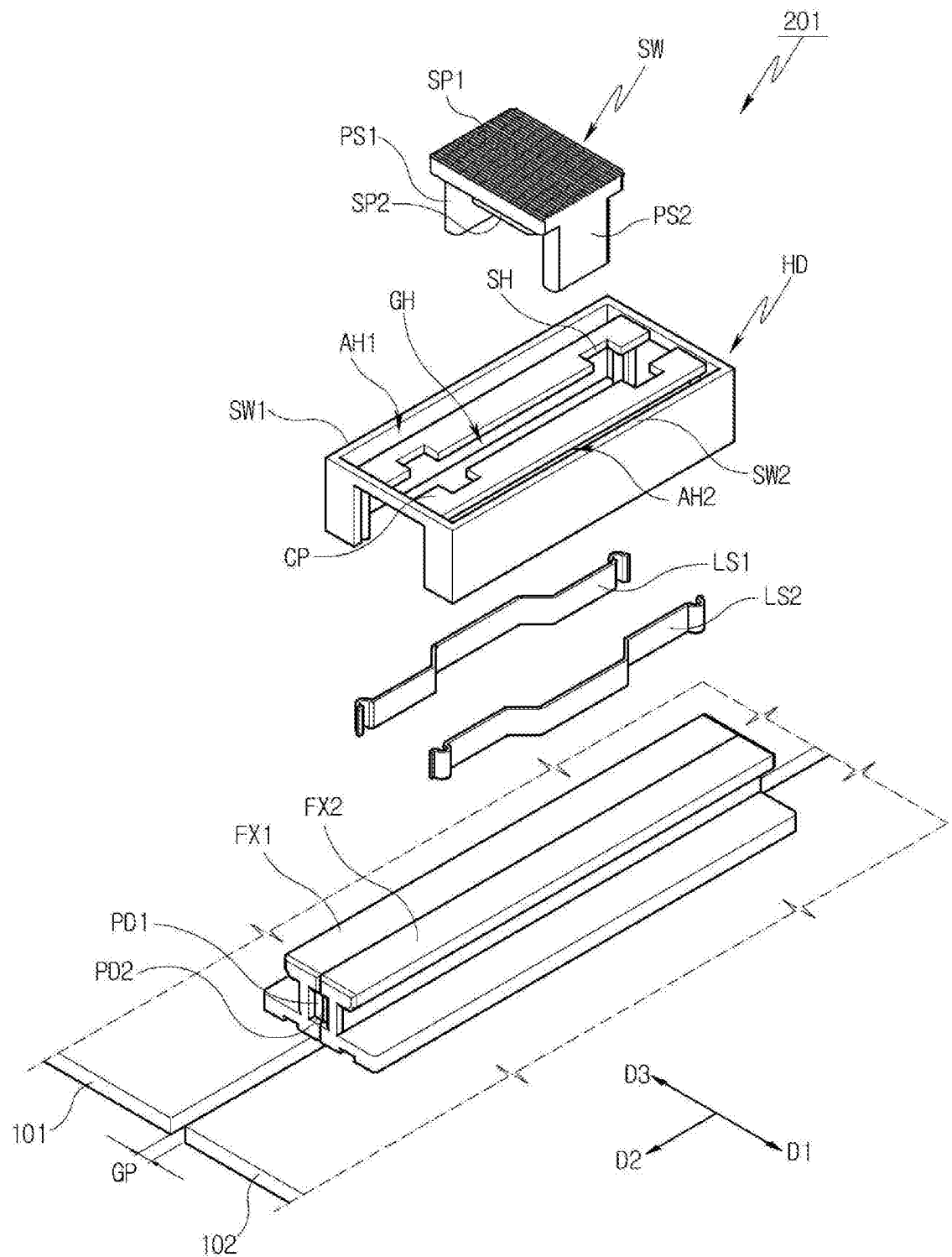

[FIG. 5]
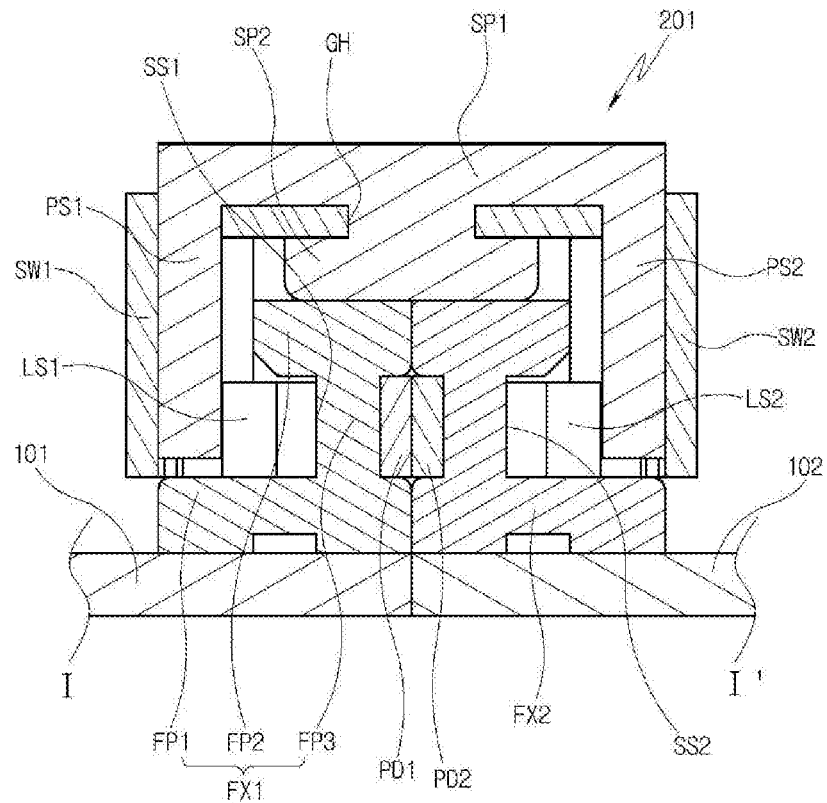
[FIG. 6A]
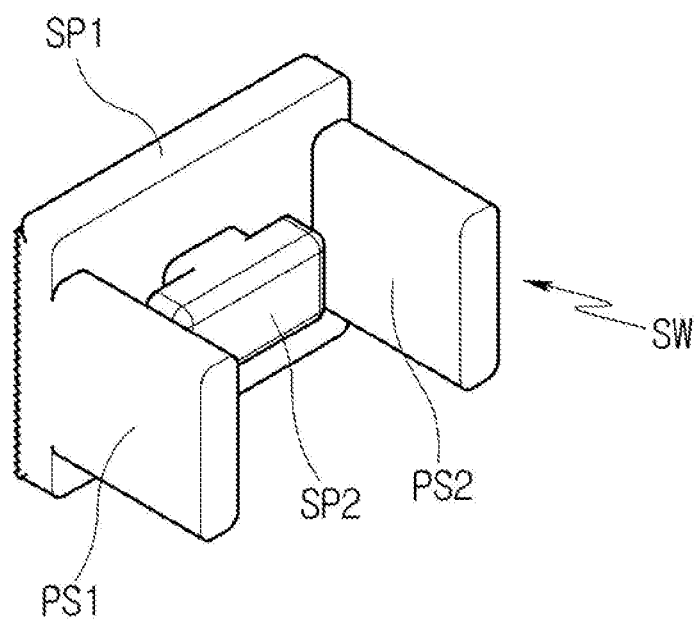

[FIG. 6B]
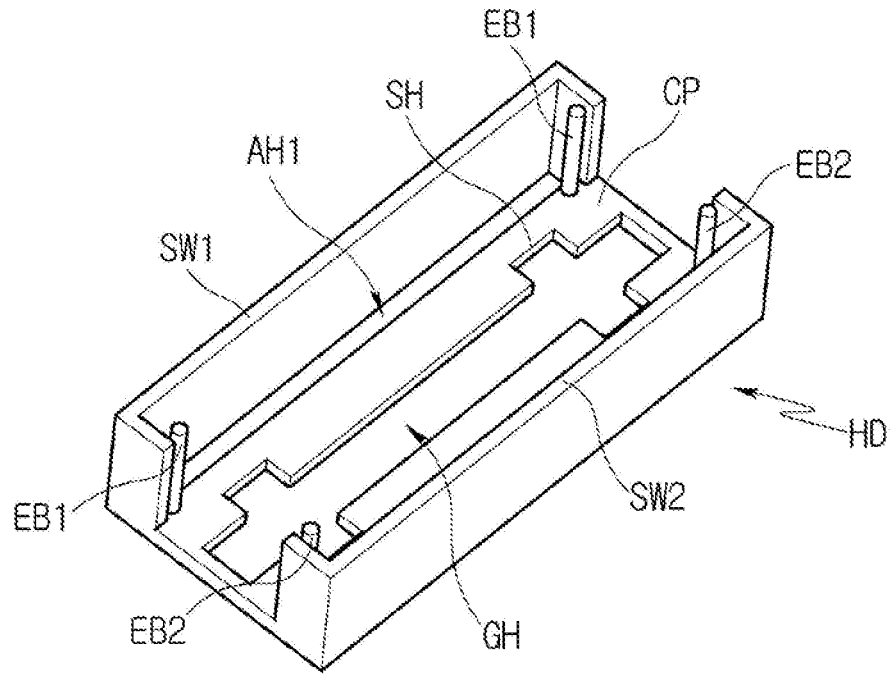
[FIG. 6C]
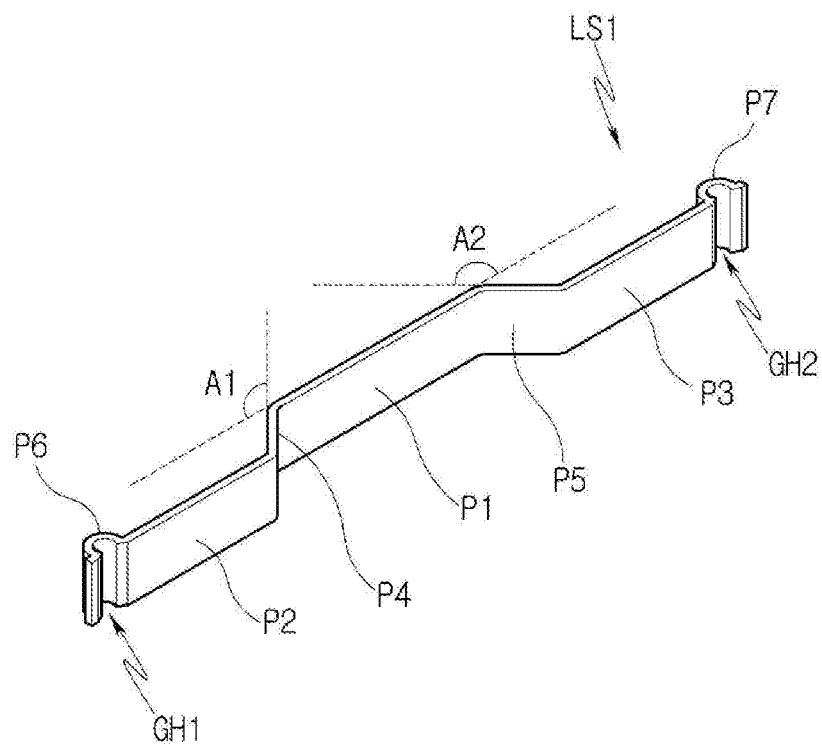

[FIG. 7A]
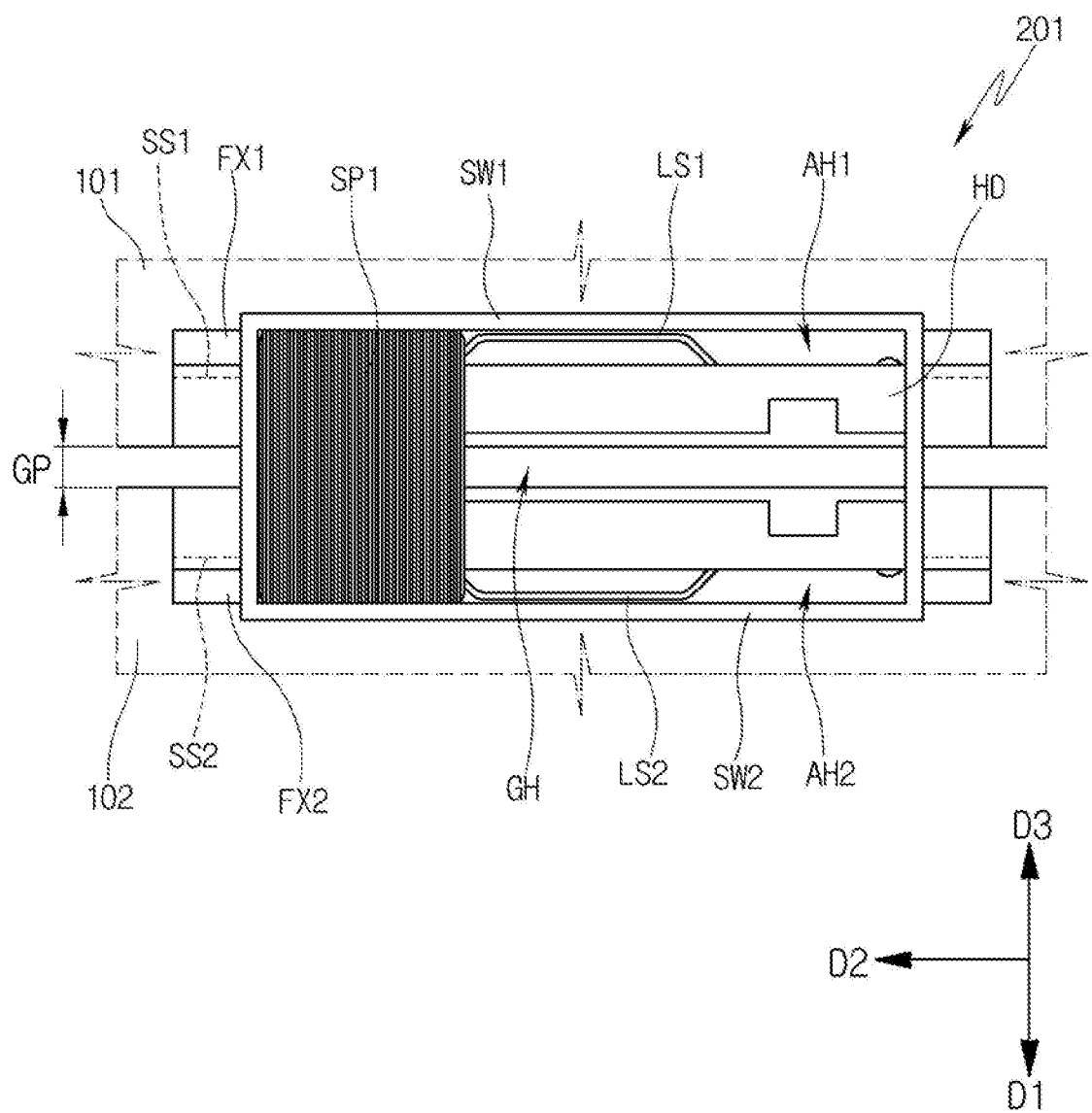

[FIG. 7B]
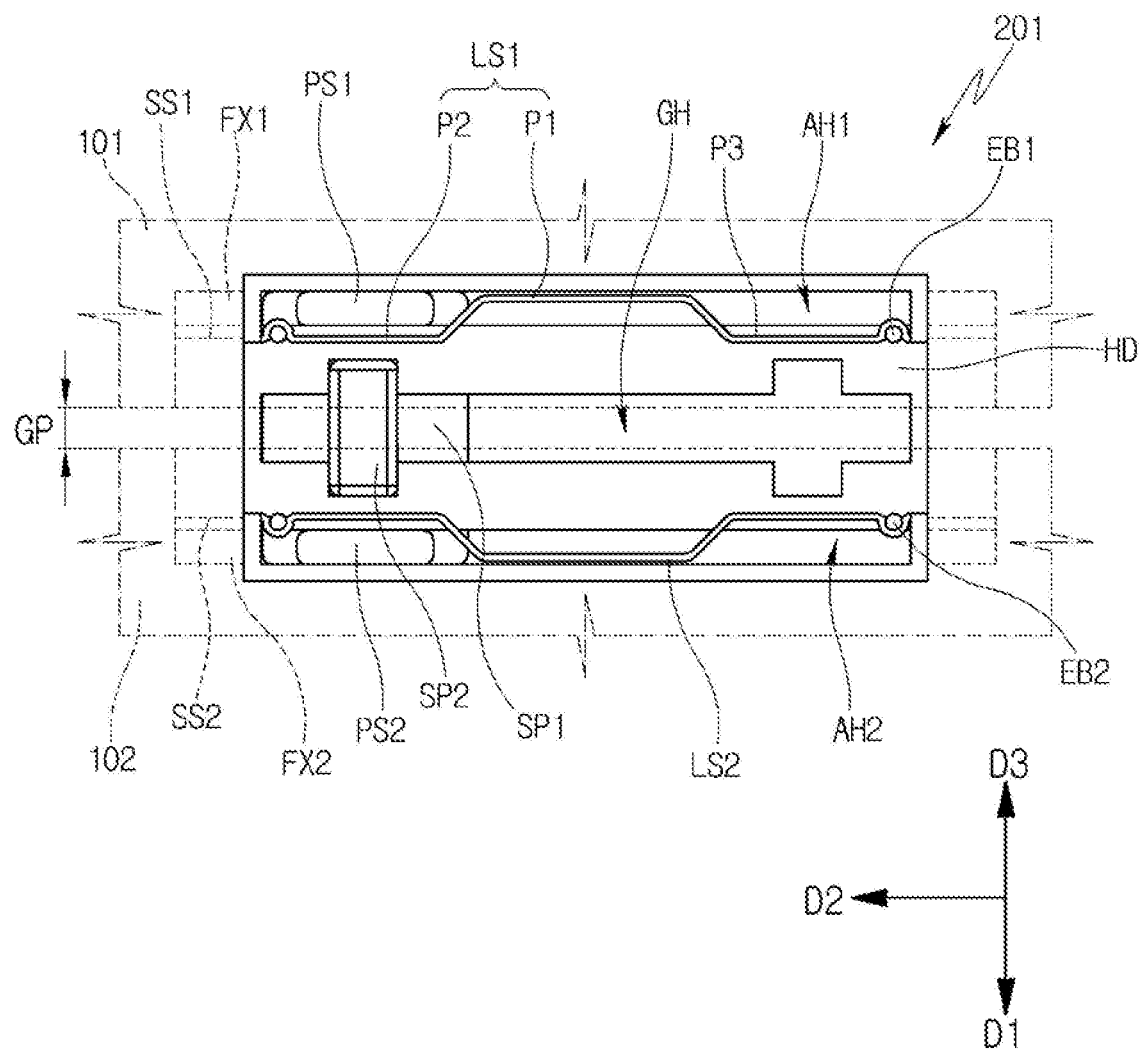

[FIG. 8]
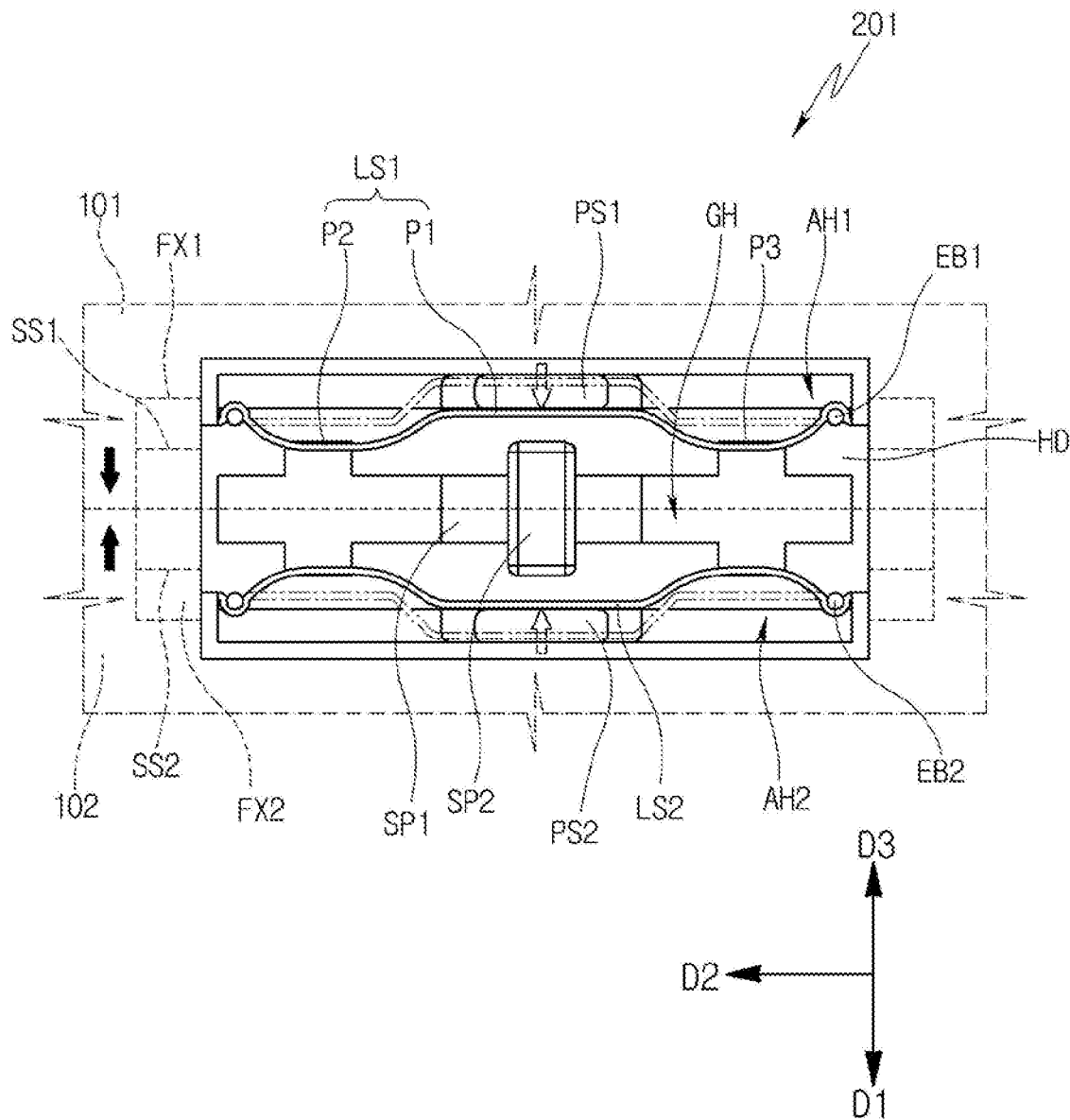

GAP REGULATOR OF MULTI DISPLAY AND MULTI DISPLAY HAVING THE SAME

CROSS-REFERENCE(S) TO RELATED APPLICATIONS

This application claims priority to Korean Patent Application No. 10-2018-0116182, filed on Sep. 28, 2018 in the Republic of Korea, the disclosure of which is incorporated herein by reference in its entirety into the present application.

BACKGROUND OF THE DISCLOSURE

Field of the Disclosure

Exemplary embodiments of the present disclosure relate to a gap regulator of a multi display (multi-display) and a multi display having the same, and more particularly to a gap regulator connected to adjacent displays of a multi display to easily adjust a gap between the adjacent displays, and a multi display having the same.

Description of the Related Art

When a display apparatus is installed in a place where many people are crowded or in a public facility used by many people, a large-scale display apparatus is required due to the nature of a place in which the display apparatus will be installed. A multi display is composed of a plurality of displays and is driven as if an image is displayed on a single screen so that the multi display can effectively provide image information to a large number of people in a public place.

Meanwhile, a large-scale display, e.g., a large-scale display of 100 inches or more, is installed for a special purpose and thus the demand for the large-scale display is not regular, whereby mass production of the large-scale display may not be desirable. Accordingly, a multi display in which a plurality of displays are combined in the form of a single display apparatus may be more practical and cost effective rather than implementing a large display with a single display.

SUMMARY OF THE DISCLOSURE

An object of the present disclosure is to provide a gap regulator capable of easily adjusting a gap between a plurality of adjacent displays in a multi display.

Another object of the present disclosure is to provide a multi display capable of being easily installed by including a gap regulator for adjusting a gap between a plurality of adjacent displays.

Other objects and advantages of the present disclosure can be understood by the following description and become apparent with reference to the embodiments of the present disclosure. Further, it is an object of the present disclosure to provide a gap regulating device which address the limitations and disadvantages associated with the related art. Also, it is obvious to those skilled in the art to which the present disclosure pertains that the objects and advantages of the present disclosure can be realized by the means as claimed and combinations thereof.

Provided herein according to an example of the present disclosure is a gap regulator for adjusting a gap between adjacent displays of a multi display, the gap regulator of the multi display including a first fixing portion, a second fixing portion, a holder, a first plate spring, a second plate spring, and a pressurizing switch.

According to an example of the present disclosure, the first fixing portion is fixed to a first display. The second fixing portion is fixed to a second display adjacent to the first display and faces the first fixing portion. The holder includes a ceiling portion, a first side wall, and a second side wall facing the first side wall. The holder is coupled to the first fixing portion and the second fixing portion through a lower opening of the holder.

According to an example of the present disclosure, the first plate spring is disposed between the first side wall and the first fixing portion to provide an elastic force to the first fixing portion. The second plate spring is disposed between the second side wall and the second fixing portion to provide an elastic force to the second fixing portion.

The pressurizing switch can be coupled to the holder and pressurizes the first plate spring and the second plate spring to the first fixing portion and the second fixing portion, respectively.

Provided herein according to an example of the present disclosure is a multi display including a first display, a second display disposed adjacent to the first display, and a gap regulator coupled to the first display and the second display and configured to adjust a gap between the first display and the second display.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 is a perspective view of a multi display according to one embodiment of the present disclosure;

FIG. 2 is a diagram illustrating a rear surface of the multi display apparatus shown in FIG. 1;

FIG. 3 is a perspective view of a gap regulator coupled to a first display and a second display which are shown in FIG. 2;

FIG. 4 is an exploded perspective view of the gap regulator shown in FIG. 3;

FIG. 5 is a cross-sectional view taken along line I-I' of FIG. 3;

FIG. 6A is a perspective view illustrating a rear surface of a pressurizing switch shown in FIG. 4;

FIG. 6B is a perspective view illustrating a rear surface of a holder shown in FIG. 4;

FIG. 6C is a perspective view illustrating a rear surface of a first plate spring shown in FIG. 4;

FIG. 7A is a plan view of the gap regulator coupled to the first display and the second display when a position of the pressurizing switch is in an OFF state;

FIG. 7B is a rear view of the gap regulator coupled to the first display and the second display when the position of the pressurizing switch is in the OFF state; and FIG. 8 is a rear view of the gap regulator coupled to the first display and the second display when the position of the pressurizing switch is in an ON state.

DESCRIPTION OF THE EMBODIMENTS

Hereinafter, embodiments of the present disclosure will be described in detail with reference to the accompanying drawings. The above objects, features, and advantages of the present disclosure will be understood through the following embodiments with reference to the accompanying drawings. However, the present disclosure is not limited to the embodiments disclosed herein and can be modified in various forms. The embodiments of the present disclosure, which will be described below, are provided to clarify the technical spirit of the present disclosure and also to fully transfer the technical spirit thereof to those skilled in the art to which the present disclosure pertains. Therefore, the scope of the present disclosure should not be construed as being limited to embodiments which will be described below. In the following embodiments and the drawings, the same reference numerals denote the same components.

Further, throughout this disclosure, terms such as a "first," "second," and the like are used not for limitative but for the purpose of distinguishing one component from another component. Further, when a portion of a film, a region, a component, or the like is referred to as being "on" another portion, this includes not only a case in which the portion is "directly on" another portion but also a case in which another film, another region, another component, or the like is interposed between the portion and another portion.

FIG. 1 is a perspective view of a multi display apparatus according to one embodiment of the present disclosure. FIG. 2 is a diagram illustrating a rear surface of the multi display apparatus shown in FIG. 1. More specifically, FIG. 2 illustrates the rear view of the multi display apparatus shown in FIG. 1 when the multi display apparatus shown in FIG. 1 is viewed in a first view direction V1. All the components of the multi display apparatus according to all embodiments of the present disclosure are operatively coupled and configured.

Referring to FIGS. 1 and 2, a multi display apparatus 500 includes a first display 101, a second display 102, a third display 103, a fourth display 104, a frame portion FR, and a plurality of gap regulators.

In the present embodiment, each of the first to fourth displays 101, 102, 103, and 104 has a display surface for displaying an image. The first to fourth displays 101, 102, 103, and 104 are arranged in a tile shape having a row direction of a first direction D1 and a column direction of a second direction D2.

In the present embodiment, the multi display apparatus 500 is composed of the four displays 101, 102, 103, and 104, but the present disclosure is not limited to the number of displays constituting the multi display apparatus 500 and a method of arranging the displays and can include any number of displays and/or display arrangements. For example, in an alternative embodiment, the number of displays constituting the multi display apparatus 500 can be two, three, or five or more arranged in any matrix configuration (e.g., 4×6), and, in a still alternative embodiment, a plurality of displays of the multi display apparatus 500 can be arranged in a single row or column.

In the present embodiment, each of the first to fourth displays 101, 102, 103, and 104 can be an organic light emitting display. However, the present disclosure is not limited to kinds of each of the first to fourth displays 101, 102, 103, and 104. For example, in an alternative embodiment, each of the first to fourth displays 101, 102, 103, and 104 can be a liquid crystal display or other types of displays.

The frame portion FR is coupled to a rear surface of each of the first to fourth displays 101, 102, 103, and 104. The first to fourth displays 101, 102, 103, and 104 can be coupled to each other by the frame portion FR. In the present embodiment, the frame portion FR can include a first frame F1 extending in the first direction D1 and a second frame F2 extending in the second direction D2.

In the present embodiment, the frame portion FR is coupled to a mounting device fixed to a wall surface so that the first to fourth displays 101, 102, 103, and 104 can be mounted on the wall surface. Alternatively, the frame portion FR is coupled to another mounting device installed on the ground so that the first to fourth displays 101, 102, 103, and 104 can be installed on the ground. Obviously, other types of mounting device can be used to position the multi display apparatus 500 in a secured and desired manner.

In the present embodiment, the first to fourth displays 101, 102, 103, and 104 can be driven so as to allow a single image to be displayed through the plurality of display surfaces of the first to fourth displays 101, 102, 103, and 104. Accordingly, the multi display apparatus 500 can provide image information to a large number of people in a public place through a large-scale display surface. Further, each of the first to fourth displays 101, 102, 103 and 104 can be independently and selectively driven to display separately contents (e.g., not part of a single image) if desired.

A plurality of gap regulators 201, 202, 203, and 204 are coupled to the rear surfaces of the first to fourth displays 101, 102, 103, and 104. Each of the plurality of gap regulators 201, 202, 203, and 204 is coupled to two adjacent displays among the first to fourth displays 101, 102, 103, and 104 to control a gap between the two adjacent displays.

Meanwhile, in the multi display apparatus 500, the gap can be visible as a portion in which an image is not displayed. Accordingly, in the embodiments of the present disclosure, the gap is adjusted to be minimized using the plurality of gap regulators 201, 202, 203, and 204 such that display quality of the multi display apparatus 500 can be improved.

In the present embodiment, the plurality of gap regulators 201, 202, 203, and 204 include first gap regulators 201, second gap regulators 202, third gap regulators 203, and fourth gap regulators 204.

Each of the first gap regulators 201 can be coupled to the first and second displays 101 and 102 to be used to adjust a gap between the first and second displays 101 and 102 in the first direction D1. Each of the first gap regulators 201 is superposed on a first boundary BA1 of the first and second displays 101 and 102. The first gap regulators 201 can be disposed to be spaced apart from each other in the second direction D2 along the first boundary BA1.

Each of the second gap regulators 202 can be coupled to the third and fourth displays 103 and 104 to be used to adjust a gap between the third and fourth displays 103 and 104 in the first direction D1. Each of the second gap regulators 202 is superposed on a second boundary BA2 of the third and fourth displays 103 and 104. The second gap regulators 202 can be disposed to be spaced apart from each other in the second direction D2 along the second boundary BA2.

Each of the third gap regulators 203 can be coupled to the first and third displays 101 and 103 to be used to adjust a gap between the first and third displays 101 and 103 in the second direction D2. Each of the third gap regulators 203 is superposed on a third boundary BA3 of the first and third displays 101 and 103. The third gap regulators 203 can be disposed to be spaced apart from each other in the first direction D1 along the third boundary BA3.

Each of the fourth gap regulators 204 can be coupled to the second and fourth displays 102 and 104 to be used to adjust a gap between the second and fourth displays 102 and 104 in the second direction D2. Each of the fourth gap regulators 204 is superposed on a fourth boundary BA4 of the second and fourth displays 102 and 104. The fourth gap regulators 204 can be disposed to be spaced apart from each other in the first direction D1 along the fourth boundary BA4.

As described above, in the present embodiment, two gap regulators are installed at each of the first to fourth boundaries BA1, BA2, BA3, and BA4. However, the present disclosure is not limited to the number of gap regulators installed at each of the first to fourth boundaries BA1, BA2, BA3, and BA4. The number of gap regulators, which will be installed, can be varied according to a length of each of the first to fourth boundaries BA1, BA2, BA3, and BA4. For instance, any number of gap regulators can be disposed at a boundary between two adjacent displays, and the gap regulators can be spaced out at a uniform or non-uniform distance.

In the present embodiment, positions at which the first to fourth gap regulators 201, 202, 203, and 204 are installed can be different from each other, but the first to fourth gap regulators 201, 202, 203, and 204 have the same structure. Therefore, a structure of one among the first to fourth gap regulators 201, 202, 203, and 204 will be described below.

FIG. 3 is a perspective view of a gap regulator coupled to the first display and the second display which are shown in FIG. 2, FIG. 4 is an exploded perspective view of the gap regulator shown in FIG. 3, and FIG. 5 is a cross-sectional view taken along line I-I' of FIG. 3.

Further, FIG. 6A is a perspective view illustrating a rear surface of a pressurizing switch SW shown in FIG. 4, FIG. 6B is a perspective view illustrating a rear surface of a holder HD shown in FIG. 4, and FIG. 6C is a perspective view illustrating a rear surface of a first plate spring LS1 shown in FIG. 4. FIGS. 6A, 6B, and 6C are provided to illustrate more detailed structures of the pressurizing switch SW, the holder HD, and the first plate spring LS1 of the gap regulator 201. Hereinafter, a description of the gap regulator 201 will be made with reference to FIGS. 6A, 6B, and 6C.

Referring to FIGS. 3, 4, and 5, the gap regulator 201 is coupled to the first and second displays 101 and 102 to be used to adjust a gap GP between the first and second displays 101 and 102 in the first direction D1. For example, a force can be applied to the first and second displays 101 and 102 using the gap regulator 201 so as to be close to each other. Consequently, a size of the gap GP can be reduced or implemented to be zero substantially.

In the present embodiment, the gap regulator 201 includes a first fixing portion FX1, a second fixing portion FX2, a first pad PD1, a second pad PD2, the holder HD, the first plate spring LS1, a second plate spring LS2, and the pressurizing switch SW.

The first fixing portion FX1 is fixed to rear surface of the first display 101. The second fixing portion FX2 is fixed to a rear surface of the second display 102 adjacent to the first display 101 in the first direction D1. The second fixing portion FX2 faces the first fixing portion FX1 by interposing the first boundary BA1 of FIG. 2.

In the present embodiment, the first and second fixing portions FX1 and FX2 can each have a symmetrical structure. Therefore, an example of a structure of the first fixing portion FX1 of the first and second fixing portions FX1 and FX2 will be described below.

In the present embodiment, the first fixing portion FX1 includes a bottom portion FP1, an upper end portion FP2, and a connecting portion FP3. The first fixing portion FX1 can be disposed adjacent to an edge of one side of the first display 101. The bottom portion FP1, the upper end portion FP2, and the connecting portion FP3 of the first fixing portion FX1 can each have a frame shape extending in the second direction D2 intersecting the first direction D1.

The bottom portion FP1 is fixed to the rear surface of the first display 101. In the present embodiment, an adhesive resin can be interposed between the bottom portion FP1 and the rear surface of the first display 101. The bottom portion FP1 is fixed to the rear surface of the first display 101 by the adhesive resin. Further, in a state in which the first fixing portion FX1 is coupled to the first plate spring LS1 and the holder HD, the first plate spring LS1 can be disposed on the bottom portion FP1.

The upper end portion FP2 is located at a height from the bottom portion FP1. In a state in which the first fixing portion FX1 is coupled to the pressurizing switch SW and the holder HD, a support SP2 of the pressurizing switch SW can be brought into contact with the upper end portion FP2 to support the upper end portion FP2.

The connecting portion FP3 is vertically connected to each of the bottom portion FP1 and the upper end portion FP2. The connecting portion FP3 connects the bottom portion FP1 to the upper end portion FP2. Further, as described above, the first plate spring LS1 is disposed on the bottom portion FP1. When the first plate spring LS1 is pressurized to the first fixing portion FX1 by the pressurizing switch SW, the first plate spring LS1 is brought into contact with a first outer surface SS1 of the connecting portion FP3. For example, the first plate spring LS1 pressurized by the pressurizing switch SW applies a force to the first fixing portion FX1 through the first outer surface SS1 in the first direction D1.

Similarly, the second fixing portion FX2 includes a bottom portion, an upper end portion, and a connecting portion to correspond to the configuration of the first fixing portion FX1. When a second plate spring LS2 is pressurized to the second fixing portion FX2 by the pressurizing switch SW, the second plate spring LS2 can be brought into contact with a second outer surface SS2 of the second fixing portion FX2. That is, the second plate spring LS2 pressurized by the pressurizing switch SW applies a force to the second fixing portion FX2 through the second outer surface SS2 in a third direction D3 opposite the first direction D1.

Thus, the first and second fixing portions FX1 and FX2 receive the forces in a direction of approaching each other due to interaction of the pressurizing switch SW, the first plate spring LS1, and the second plate spring LS2. Consequently, the first and second displays 101 and 102 fixed to the first and second fixing portions FX1 and FX2 are shifted to approach each other such that a size of the gap GP can be reduced or implemented to be zero substantially.

In the present embodiment, a groove can be formed on a first inner surface opposite to the first outer surface SS1 of the connecting portion FP3 in the second direction D2, and a first pad PD1 can be accommodated in the groove. A material constituting the first pad PD1 can include a material having elasticity such as rubber.

Like the first fixing portion FX1, a groove can be formed on a second inner surface opposite to the second outer surface SS2 of the connecting portion of the second fixing portion FX2 in the second direction D2, and a second pad PD2 can be accommodated in the groove. Therefore, in the process of reducing the gap GP using the gap regulator 201, it is possible to prevent damage of the first fixing portion FX1 and the second fixing portion FX2 due to a contact therebetween with an excessive pressure.

The holder HD includes a ceiling portion CP, a first side wall SW1, and a second side wall SW2. The holder HD is coupled to the first fixing portion FX1 and the second fixing portion FX2 through an opening of a lower portion of the holder HD. In the present embodiment, when the holder HD is viewed in plan view, the holder HD can be superposed with the first and second displays 101 and 102, and the ceiling portion CP, the first side wall SW1, and the second side wall SW2 can each have a shape extending in the second direction D2.

In the present embodiment, a guide hole GH, a first auxiliary guide hole AH1, and a second auxiliary guide hole AH2 can be defined in the ceiling portion CP. A length direction of each of the guide hole GH, the first auxiliary guide hole AH1, and the second auxiliary guide hole AH2 can be parallel to the second direction D2. The first auxiliary guide hole AH1 is adjacent to the first side wall SW1 and is formed therealong, and the second auxiliary guide hole AH2 is adjacent to the second side wall SW2 and is formed therealong. Further, the guide hole GH is formed along between the first auxiliary guide hole AH1 and the second auxiliary guide hole AH2.

In the present embodiment, the guide hole GH, the first auxiliary guide hole AH1, and the second auxiliary guide hole AH2 are formed in the ceiling portion CP so as to partially accommodate the pressurizing switch SW in the holder HD. Further, the guide hole GH, the first auxiliary guide hole AH1, and the second auxiliary guide hole AH2 are each formed in the second direction D2, and the pressurizing switch SW is moved in the second direction D2 and in a direction opposite the second direction D2 in a state of being partially accommodated in the holder HD. Simultaneously, the pressurizing switch SW can switch pressurization to the first and second fixing portions FX1 and FX2 using the first and second plate springs LS1 and LS2 according to a position of the pressurizing switch SW in the holder HD. This will be described in more detail with reference to FIGS. 7A, 7B, and 8.

In the present embodiment, a hook hole SH can be further defined in the ceiling portion CP of the holder HD. The hook hole SH can be connected to the guide hole GH and located on each of both sides of the guide hole GH. The hook hole SH can be formed in the holder HD so as to accommodate the support SP2 of the pressurizing switch SW in the holder HD. A shape of the hook hole SH can correspond to a shape of the support SP2 of the pressurizing switch SW. A size of the hook hole SH can be larger than a size of the support SP2 and be smaller than a size of a switch portion SP1.

Meanwhile, in a method of connecting the pressurizing switch SW to the holder HD, the first pressurizing portion PS1, the second pressurizing portion PS2, and the support SP2 are inserted to correspond one-to-one to the first auxiliary guide hole AH1, the second auxiliary guide hole AH2, and the hook hole SH. The switch portion SPlmay not pass through the ceiling portion CP to be placed thereon. Thus, the switch portion SP1 can be moved on the ceiling portion CP through the guide hole GH in a sliding manner in the second direction D2 or in the direction opposite the second direction D2.

In the present embodiment, the holder HD can further include a plurality of first protrusions EB1 and a plurality of second protrusions EB2. The plurality of first protrusions EB1 can be coupled to the first plate spring LS1, and the plurality of second protrusions EB2 can be coupled to the second plate spring LS2.

As shown in FIG. 6B, in the present embodiment, the number of the plurality of first protrusions EB1 can be two, and the plurality of first protrusions EB1 can be disposed to correspond one-to-one to both end portions of the first side wall SW1. Further, the plurality of first protrusions EB1 can each have a shape protruding from an inner surface of the holder HD. In the present embodiment, the plurality of first protrusions EB1 can each have a shape protruding from an inner surface of the ceiling portion CP.

As shown in FIG. 6B, in the present embodiment, the number of the plurality of second protrusions EB2 can be two, and the plurality of second protrusions EB2 can be disposed to correspond one-to-one to both end portions of the second side wall SW2. Further, the plurality of second protrusions EB2 can each have a shape protruding from the inner surface of the holder HD. In the present embodiment, the plurality of second protrusions EB2 can each have a shape protruding from the inner surface of the ceiling portion CP.

Each of the first plate spring LS1 and the second plate spring LS2 has a structure in which a plate extending in the second direction D2 is bent several times. The first plate spring LS1 is disposed between the first side wall SW1 and the first fixing portion FX1, and the second plate spring LS2 is disposed between the second side wall SW2 and the second fixing portion FX2.

Further, as the pressurizing switch SW is moved in the second direction D2 and in the direction opposite the second direction D2 in a state of being coupled to the holder HD, the pressurizing switch SW can pressurize the first and second plate springs LS1 and LS2. Further, the first plate spring LS1 provides an elastic force to the first fixing portion FX1 in the first direction D1 by the above-described operation of the pressurizing switch SW, and the second plate spring LS2 provides an elastic force to the second fixing portion FX2 in the third direction D3. In this case, as shown in FIG. 5, the elastic force of the first plate spring LS1 can be delivered to the first fixing portion FX1 through the first outer surface SS1, and the elastic force of the second plate spring LS2 can be delivered to the second fixing portion FX2 through the second outer surface SS2.

As described above, when the first and second plate springs LS1 and LS2 provide the elastic forces to the first and second fixing portions FX1 and FX2 so as to allow the first and second fixing portions FX1 and FX2 to approach each other, the first display 101 fixed to the first fixing portion FX can be shifted in the first direction D1, and the second display 102 fixed to the second fixing portion FX2 can be shifted in the third direction D3. Consequently, a size of the gap GP between the first and second displays 101 and 102 in the first direction D1 or the third direction D3 can be reduced or implemented to be zero substantially.

In the present embodiment, positions of the first plate spring LS1 and the second plate spring LS2 are different from each other in the holder HD, but the first plate spring LS1 and the second plate spring LS2 can have the same structure. Therefore, a structure of the first plate spring LS1 will be described below, and a description of a structure of the second plate spring LS2 will be omitted for the sake of brevity.

In the present embodiment, the first plate spring LS1 includes a central portion P1, a first elastic portion P2, a second elastic portion P3, a first bent portion P4, a second bent portion P5, a first coupling portion P6, and a second coupling portion P7. However, for convenience of description, the first plate spring LS1 is described as being divided into a plurality of portions. In the present embodiment, the first plate spring LS1 can have a shape in which the plurality of divided portions are formed integrally.

The central portion P1 is located in a center of the first plate spring LS1. The first elastic portion P2 can be disposed at one side of the central portion P1, the second elastic portion P3 is disposed at the other side of the central portion P1, and the first elastic portion P2 and the second elastic portion P3 can each have a shape extending in a direction parallel to the central portion P1.

The first bent portion P4 is located between the central portion P1 and the first elastic portion P2 to connect the central portion P1 to the first elastic portion P2. The first bent portion P4 has a shape bent from the central portion P1 and the first elastic portion P2. Further, the second bent portion P5 is located between the central portion P1 and the second elastic portion P3 to connect the central portion P1 to the second elastic portion P3. The second bent portion P5 has a shape bent from the central portion P1 and the second elastic portion P3.

In the present embodiment, when a first angle A1 between the central portion P1 and the first bent portion P4 is defined, the first angle A1 can be an obtuse angle. Further, as described above, since the first elastic portion P2 is parallel to the central portion P1, an angle formed between the first elastic portion P2 and the first bent portion P4 can also be an obtuse angle.

Furthermore, when a second angle A2 between the central portion P1 and the second bent portion P5 is defined, the second angle A2 can be an obtuse angle. In addition, as described above, since the second elastic portion P3 is parallel to the central portion P1, an angle formed between the second elastic portion P3 and the second bent portion P5 can be an obtuse angle.

As described above, when each of the first angle A1 and the second angle A2 is an obtuse angle, and, in order to induce generation of an elastic force of the first plate spring LS1, the pressurizing switch SW is operated to slid in the second direction D2 in a state of being coupled to the holder HD, movement of the pressurizing switch SW from the first elastic portion P2 or the second elastic portion P3 to the central portion P1 can be performed more smoothly.

In the present embodiment, the first coupling portion P6 and the second coupling portion P7 are provided to correspond one-to-one to both edges of the first plate spring LS1. The first coupling portion P6 is coupled to any one of the plurality of first protrusions EB1, and the second coupling portion P7 is coupled to the other one of the plurality of first protrusions EB1. Thus, the first plate spring LS1 can be coupled to the holder HD.

In the present embodiment, when the first plate spring LS1 is viewed in a plan view, a first coupling groove GH1 having a shape opened to one side is defined in the first coupling portion P6, and a second coupling groove GH2 having a shape opened to one side is defined in the second coupling portion P7. Thus, the first plate spring LS1 can be coupled to the holder HD in a manner in which the plurality of first protrusions EB1 are accommodated in the first and second coupling grooves GH1 and GH2.

Further, like the first plate spring LS1, two coupling portions having shapes identical to those of the first and second coupling portions P6 and P7 can be provided at both edges of the second plate spring LS2. The two coupling portions of the second plate spring LS2 are coupled to the plurality of second protrusions EB2 such that the second plate spring LS2 can be coupled to the holder HD.

As described above, when each of the first angle A1 and the second angle A2 is an obtuse angle, and, in order to induce generation of an elastic force of the first plate spring LS1, the pressurizing switch SW is operated to slide in the second direction D2 in a state of being coupled to the holder HD, movement of the pressurizing switch SW from the first elastic portion P2 or the second elastic portion P3 to the central portion P1 can be performed more smoothly.

Meanwhile, in a state in which the first plate spring LS1 is coupled to the holder HD by the first and second coupling portions P6 and P7, owing to the bent structure of the first plate spring LS1, the first elastic portion P2 is located to be more adjacent to the guide hole GH than the central portion P1, and the second elastic portion P3 is located to be more adjacent to the guide hole GH than the central portion P1. Therefore, when a pressurizing force acts to the central portion P1 by the first pressurizing portion PS1 of the pressurizing switch SW in the first direction D1, the pressurizing force is delivered to the first elastic portion P2 and the second elastic portion P3 so that the first elastic portion P2 and the second elastic portion P3 are pressurized in the first direction D1.

Further, when the first elastic portion P2 and the second elastic portion P3 are pressurized in the first direction D1, the first elastic portion P2 and the second elastic portion P3 can be in contact with the first fixing portion FX1 to pressurize the first fixing portion FX1. Simultaneously, an elastic force acts on each of the first elastic portion P2 and the second elastic portion P3 due to the bent structure of the first plate spring LS1 such that an action in which the first elastic portion P2 and the second elastic portion P3 pressurize the first fixing portion FX1 can be maintained.

The pressurizing switch SW is coupled to the holder HD. Further, the pressurizing switch SW is moved on the ceiling portion CP of the holder HD along the guide hole GH in a sliding manner. As the pressurizing switch SW is moved in the sliding manner, the pressurizing switch SW can switch pressurization to the first plate spring LS1 and the second plate spring LS2.

In the present embodiment, the pressurizing switch SW includes the first pressurizing portion PS1, the second pressurizing portion PS2, the switch portion SP1, and the support SP2. The first pressurizing portion PS1 is accommodated in the holder HD through the first auxiliary guide hole AH1. The first pressurizing portion PS1 is disposed between the first side wall SW1 and the first plate spring LS1. Further, the second pressurizing portion PS2 is accommodated in the holder HD through the second auxiliary guide hole AH2. The second pressurizing portion PS2 is disposed between the second side wall SW2 and the second plate spring LS2.

The switch portion SP1 is located on the ceiling portion CP. The switch portion SP1 is an externally exposed portion of the pressurizing switch SW. The switch portion SP1 can be handled by an operator so that the movement of the pressurizing switch SW in the sliding manner can be manipulated.

The support SP2 is accommodated in the holder HD through the hook hole SH. The support SP2 can be connected to the switch portion SP1 through the hook hole SH or the guide hole GH, and the support SP2 can face to the switch portion SP1. The support SP2 supports the upper end portion FP2 of each of the first and second fixing portions FX1 and FX2. Therefore, the elastic forces of the first and second plate springs LS1 and LS2, which are generated by manipulating the pressurizing switch SW in a state in which the first and second fixing portions FX1 and FX2 are firmly supported by the support SP2, can be applied to the first and second fixing portions FX1 and FX2.

Hereinafter, a process of adjusting the gap GP between the first and second displays 101 and 102 by manipulating the pressurizing switch SW will be described with reference to FIGS. 7A, 7B, and 8.

FIG. 7A is a plan view of a gap regulator coupled with a first display and a second display when a position of a pressurizing switch is in an OFF state, and FIG. 7B is a rear view of the gap regulator coupled to the first display and the second display when the position of the pressurizing switch is in the OFF state. Further, FIG. 8 is a rear view of the gap regulator coupled to the first display and the second display when the position of pressurizing switch is in an ON state. Further, in a description of FIGS. 7A, 7B, and 8, the same reference numerals are assigned to the same components described in the above embodiments, and an overlapping description thereof will be omitted or brief.

Referring to FIGS. 4, 7A, and 7B, FIGS. 7A and 7B illustrate an OFF state of the pressurizing switch SW of the gap regulator 201.

In the present embodiment, the OFF state of the pressurizing switch SW can be defined as a state before the pressurizing switch SW pressurizes the first plate spring LS1 and the second plate spring LS2. When the pressurizing switch SW is in the OFF state, the first pressurizing portion PS1 of the pressurizing switch SW can be spaced apart from the central portion P1 of the first plate spring LS1, and the second pressurizing portion PS2 of the pressurizing switch SW can be spaced apart from the central portion of the second plate spring LS2.

Consequently, the first plate spring LS1 is spaced apart from the first outer surface SS1 of the first fixing portion FX1 fixed to the first display 101, or a pressurizing force or an elastic force by the first plate spring LS1 is not applied to the first outer surface SS1 in the first direction D1. Further, like the first plate spring LS1, the second plate spring LS2 is spaced apart from the second outer surface SS2 of the second fixing portion FX2 fixed to the second display 102, or a pressurizing force or an elastic force by the second plate spring LS2 is not applied to the second outer surface SS2 in the third direction D3.

Referring to FIG. 8, an ON state of the pressurizing switch SW of the gap regulator 201 is illustrated in FIG. 8. Switching of the pressurizing switch SW from the OFF state to the ON state can be implemented by moving the switch portion SP1 in the direction opposite the second direction D2 in a sliding manner.

In the present embodiment, the ON state of the pressurizing switch SW can be defined as a state in which the pressurizing switch SW pressurizes the first plate spring LS1 and the second plate spring LS2. When the pressurizing switch SW is in an ON state, the first pressurizing portion PS1 of the pressurizing switch SW can be in contact with the central portion P1 of the first plate spring LS1 to pressurize the central portion P1 in the first direction D1, and the second pressurizing portion PS2 of the pressurizing switch SW can be in contact with the central portion of the second plate spring LS2 to pressurize the central portion of the second plate spring LS2 in the third direction D3.

Meanwhile, when a pressurizing force acts on the first plate spring LS1 by the first pressurizing portion PS1 of the pressurizing switch SW, the pressurizing force is delivered to the first elastic portion P2 and the second elastic portion P3 of the first plate spring LS1 due to the bent structure of the first plate spring LS1. Consequently, the first elastic portion P2 and the second elastic portion P3 are pressurized in the first direction D1.

Further, when the first elastic portion P2 and the second elastic portion P3 are pressurized in the first direction D1, the first elastic portion P2 and the second elastic portion P3 can be in contact with the first outer surface SS1 of the first fixing portion FX1 to pressurize the first fixing portion FX1 in the first direction D1. Simultaneously, an elastic force acts on the first elastic portion P2 and the second elastic portion P3 in the first direction D1 due to the bent structure of the first plate spring LS1 such that an action in which the first elastic portion P2 and the second elastic portion P3 pressurize the first fixing portion FX1 in the first direction D1 can be maintained.

Like the above-described first plate spring LS1, when a pressurizing force acts on the second plate spring LS2 by the second pressurizing portion PS2 of the pressurizing switch SW, the second plate spring LS2 can be in contact with the second outer surface SS2 of the second fixing portion FX2 to pressurize the second fixing portion FX2 in the third direction D3. Simultaneously, an elastic force acts in the third direction D3 due to the bent structure of the second plate spring LS2 such that an action in which the second fixing portion FX2 is pressurized in the third direction D3 can be maintained.

According to the above-described actions of the pressurizing switch SW, the first plate spring LS1, and the second plate spring LS2, a force can act on the first and second fixing portions FX1 and FX2 in a direction of approaching each other. Consequently, the first and second displays 101 and 102 fixed to the first and second fixing portions FX1 and FX2 are shifted to approach each other. Therefore, a size of the gap GP between the first and second displays 101 and 102 in the first direction D1 or the third direction D3 can be reduced or be easily implemented to be zero substantially.

In accordance with a gap regulator of a multi display according to the embodiments of the present disclosure, a gap between adjacent displays of a multi display can be adjusted easily. Therefore, the gap generated during a process of arranging a plurality of displays for realizing a multi display apparatus can be easily adjusted by the gap regulator so that a portion in which an image is not displayed due to the gap in the entire display screen of the multi display apparatus can be minimized. Consequently, the display quality of the multi display apparatus can be improved.

Further, in accordance with the embodiments of the present disclosure, since the gap between the displays is adjusted by the gap regulator coupled to a rear surface of each of the displays, frames installed on a front surface of each of the displays for preventing generation of the gap between the displays can be omitted. Therefore, an installation work of the multi display can be simplified and, as the frames installed on the front surface of each of the displays are omitted, the display quality of the multi display can be improved.

Although the description has been made with reference to the embodiments of the present disclosure, it should be understood that various alternations and modifications of the present disclosure can be devised by those skilled in the art to which the present disclosure pertains without departing from the spirit and scope of the present disclosure, which are defined by the appended claims.

What is claimed is:

1. A gap regulator for adjusting a gap between adjacent displays of a multi display including a first display and a second display, the gap regulator comprising:
   a first fixing portion fixed to the first display;
   a second fixing portion fixed to the second display adjacent to the first display, and configured to face the first fixing portion;
   a holder including a ceiling portion, a first side wall, and a second side wall facing the first side wall, the holder coupled to the first fixing portion and the second fixing portion through a lower opening;

a first plate spring disposed between the first side wall and the first fixing portion, and configured to provide an elastic force to the first fixing portion;

a second plate spring disposed between the second side wall and the second fixing portion, and configured to provide an elastic force to the second fixing portion; and a pressurizing switch coupled to the holder, and configured to pressurize the first plate spring and the second plate spring to the first fixing portion and the second fixing portion, respectively.

2. The gap regulator of claim 1, wherein the pressurizing switch includes:

a first pressurizing portion disposed between the first side wall and the first plate spring;

a second pressurizing portion disposed between the second side wall and the second plate spring; and a switch portion connected to the first pressurizing portion and the second pressurizing portion to be disposed on the ceiling portion, wherein the pressurizing switch is configured to be movable in a length direction of a guide hole defined in the ceiling portion to switch pressurization to the first plate spring and the second plate spring.

3. The gap regulator of claim 2, wherein each of the first plate spring and the second plate spring includes:

a central portion;

a first elastic portion disposed at one side of the central portion;

a first bent portion configured to connect the central portion to the first elastic portion between the central portion and the first elastic portion;

a second elastic portion disposed at another side of the central portion; and a second bent portion configured to connect the central portion to the second elastic portion between the central portion and the second elastic portion, wherein the first elastic portion is to be more adjacent to the guide hole than the central portion due to a bent structure of the first bent portion, and the second elastic portion is to be more adjacent to the guide hole than the central portion due to a bent structure of the second bent portion.

4. The gap regulator of claim 3, wherein:

an angle defined by the first bent portion and each of the central portion and the first elastic portion is an obtuse angle, and an angle defined by the second bent portion and each of the central portion and the second elastic portion is an obtuse angle.

5. The gap regulator of claim 2, wherein:

a first auxiliary guide hole adjacent to the first side wall and a second auxiliary guide hole adjacent to the second side wall are defined in the ceiling portion, when the holder is viewed in plan view, each of the first auxiliary guide hole and the second auxiliary guide hole is formed to be parallel to the guide hole in the length direction of the guide hole, and the guide hole is located between the first auxiliary guide hole and the second auxiliary guide hole, and the first pressurizing portion is connected to the switch portion through the first auxiliary guide hole, and the second pressurizing portion is connected to the switch portion through the second auxiliary guide hole.

6. The gap regulator of claim 2, wherein the pressurizing switch further includes a support, and wherein the support is accommodated in the holder to be connected to the switch portion through the guide hole, the support is located between the first pressurizing portion and the second pressurizing portion, and the support is configured to support the first fixing portion and the second fixing portion.

7. The gap regulator of claim 6, wherein:

a hook hole having a shape corresponding to a shape of the support is defined in at least one side of the guide hole, and the hook hole is connected to the guide hole.

8. The gap regulator of claim 6, wherein each of the first fixing portion and the second fixing portion includes:

a bottom portion fixed to a rear surface of a corresponding one of the first and second displays;

an upper end portion located at a height from the bottom portion; and a connecting portion configured to connect the bottom portion to the upper end portion, wherein a corresponding one of the first and second plate springs is disposed on the bottom portion to be in contact with an outer surface of the connecting portion, and the support is disposed on the upper end portion.

9. The gap regulator of claim 8, further comprising:

a pad formed of a material having elasticity, the pad interposed between the first fixing portion and the second fixing portion, wherein the pad is accommodated in a groove defined in a connecting portion of each of the first fixing portion and the second fixing portion.

10. The gap regulator of claim 1, wherein the holder further includes:

a first protrusion adjacent to the first side wall and having a shape protruding from an inner surface of the holder; and a second protrusion adjacent to the second side wall and having a shape protruding from the inner surface of the holder, the first plate spring includes a first coupling portion coupled to the first protrusion, and the second plate spring includes a second coupling portion coupled to the second protrusion.

11. A multi display comprising:

a first display;

a second display disposed adjacent to the first display; and a gap regulator coupled to the first display and the second display, the gap regulator configured to adjust a gap between the first display and the second display, wherein the gap regulator includes:

a first fixing portion fixed to the first display;

a second fixing portion fixed to the second display, and configured to face the first fixing portion;

a holder including a ceiling portion, a first side wall, and a second side wall facing the first side wall, and the holder coupled to the first fixing portion and the second fixing portion through a lower opening;

a first plate spring disposed between the first side wall and the first fixing portion, and configured to provide an elastic force to the first fixing portion;

a second plate spring disposed between the second side wall and the second fixing portion, and configured to provide an elastic force to the second fixing portion; and a pressurizing switch coupled to the holder, and configured to pressurize the first plate spring and the second plate spring to the first fixing portion and the second fixing portion, respectively.

12. The multi display of claim 11, wherein the pressurizing switch further includes:
- a first pressurizing portion disposed between the first side wall and the first plate spring;
- a second pressurizing portion disposed between the second side wall and the second plate spring;
- a switch portion connected to the first pressurizing portion and the second pressurizing portion to be disposed on the ceiling portion; and
- a support located between the first pressurizing portion and the second pressurizing portion and configured to support the first fixing portion and the second fixing portion,
- wherein the pressurizing switch is configured to be movable in a length direction of a guide hole defined in the ceiling portion to switch pressurization to the first plate spring and the second plate spring, and
- the support is accommodated in the holder and connected to the switch portion through the guide hole.

13. The multi display of claim 12, wherein each of the first plate spring and the second plate spring includes:
- a central portion;
- a first elastic portion disposed at one side of the central portion;
- a first bent portion configured to connect the central portion to the first elastic portion between the central portion and the first elastic portion;
- a second elastic portion disposed at another side of the central portion; and
- a second bent portion configured to connect the central portion to the second elastic portion between the central portion and the second elastic portion,
- wherein the first elastic portion is to be more adjacent to the guide hole than the central portion due to a bent structure of the first bent portion, and the second elastic portion is to be more adjacent to the guide hole than the central portion due to a bent structure of the second bent portion, and
- an angle defined by the first bent portion and each of the central portion and the first elastic portion is an obtuse angle, and an angle defined by the second bent portion and each of the central portion and the second elastic portion is an obtuse angle.

14. The multi display of claim 12, wherein a first auxiliary guide hole adjacent to the first side wall and a second auxiliary guide hole adjacent to the second side wall are defined in the ceiling portion,
- when the holder is viewed in plan view, each of the first auxiliary guide hole and the second auxiliary guide hole is formed to be parallel to the guide hole in the length direction of the guide hole, and the guide hole is located between the first auxiliary guide hole and the second auxiliary guide hole, and
- the first pressurizing portion is connected to the switch portion through the first auxiliary guide hole, and the second pressurizing portion is connected to the switch portion through the second auxiliary guide hole.

15. The multi display of claim 12, wherein each of the first fixing portion and the second fixing portion includes:
- a bottom portion fixed to a rear surface of a corresponding one of the first and second displays;
- an upper end portion located at a height from the bottom portion; and
- a connecting portion configured to connect the bottom portion to the upper end portion,
- wherein a corresponding one of the first and second plate springs is disposed on the bottom portion to be in contact with an outer surface of the connecting portion, and the support is disposed on the upper end portion.

16. The multi display of claim 15, wherein the gap regulator further comprising:
- a pad formed of a material having elasticity, the pad interposed between the first fixing portion and the second fixing portion,
- wherein the pad is accommodated in a groove defined in a connecting portion of each of the first fixing portion and the second fixing portion.

17. The multi display of claim 11, wherein the holder further includes:
- a first protrusion adjacent to the first side wall and having a shape protruding from an inner surface of the holder; and
- a second protrusion adjacent to the second side wall and having a shape protruding from the inner surface of the holder,
- the first plate spring includes a first coupling portion coupled to the first protrusion, and
- the second plate spring includes a second coupling portion coupled to the second protrusion.

* * * * *